(12) United States Patent
Kachalov et al.

(10) Patent No.: US 6,992,261 B2
(45) Date of Patent: Jan. 31, 2006

(54) SPUTTERING TARGET ASSEMBLIES USING RESISTANCE WELDING

(75) Inventors: Mikhail Y. Kachalov, Virginia Beach, VA (US); Charles E. Wickersham, Jr., Columbus, OH (US)

(73) Assignee: Cabot Corporation, Boston, MA (US)

( * ) Notice: Subject to any disclaimer, the term of this patent is extended or adjusted under 35 U.S.C. 154(b) by 215 days.

(21) Appl. No.: 10/620,314

(22) Filed: Jul. 15, 2003

(65) Prior Publication Data

US 2005/0011749 A1      Jan. 20, 2005

(51) Int. Cl.
*B23K 11/14*        (2006.01)

(52) U.S. Cl. .............................. 219/78.02; 204/298.12; 219/91.23; 219/93

(58) Field of Classification Search ............... 219/50, 219/78.01, 78.02, 78.16, 91.23, 93; 204/298.12
See application file for complete search history.

(56) References Cited

U.S. PATENT DOCUMENTS

| | | | |
|---|---|---|---|
| 828,033 A * | 8/1906 | Lachman | 219/93 |
| 3,452,421 A | 7/1969 | Cheng et al. | 29/470.3 |
| 3,511,962 A * | 5/1970 | Suter | 219/93 |
| 3,693,238 A | 9/1972 | Hoch et al. | 29/470.3 |
| 3,998,376 A | 12/1976 | Haines | 228/154 |
| 4,349,954 A | 9/1982 | Banks | 29/458 |
| 4,722,824 A * | 2/1988 | Wiech, Jr. | 219/93 |
| 5,342,496 A | 8/1994 | Stellrecht | 204/298.12 |
| 5,693,203 A | 12/1997 | Ohhashi et al. | 204/298.12 |
| 5,836,506 A | 11/1998 | Hunt et al. | 228/172 |
| 5,863,398 A | 1/1999 | Kardokus et al. | 204/298.13 |
| 6,071,389 A | 6/2000 | Zhang | 204/298.12 |
| 6,183,613 B1 | 2/2001 | Gilman et al. | 204/298.12 |
| 6,348,113 B1 | 2/2002 | Michaluk et al. | 148/668 |

FOREIGN PATENT DOCUMENTS

| | | |
|---|---|---|
| JP | 01-283367 A  *| 11/1989 |
| WO | WO 00/15863 | 3/2000 |
| WO | WO 02/47865 A1 | 6/2002 |
| WO | WO 02/49785 A1 | 6/2002 |

* cited by examiner

*Primary Examiner*—Clifford C. Shaw

(57) ABSTRACT

A method of forming a sputtering target assembly and other metal articles is described. Sputtering target assemblies and metal articles are also described. The method includes bonding a sputter target to a backing plate using resistance heating or welding to bond assembly members that respectively include mating projections and grooves formed in bonding surfaces thereof.

45 Claims, 4 Drawing Sheets

Resistance weld interlocking target assembly method.

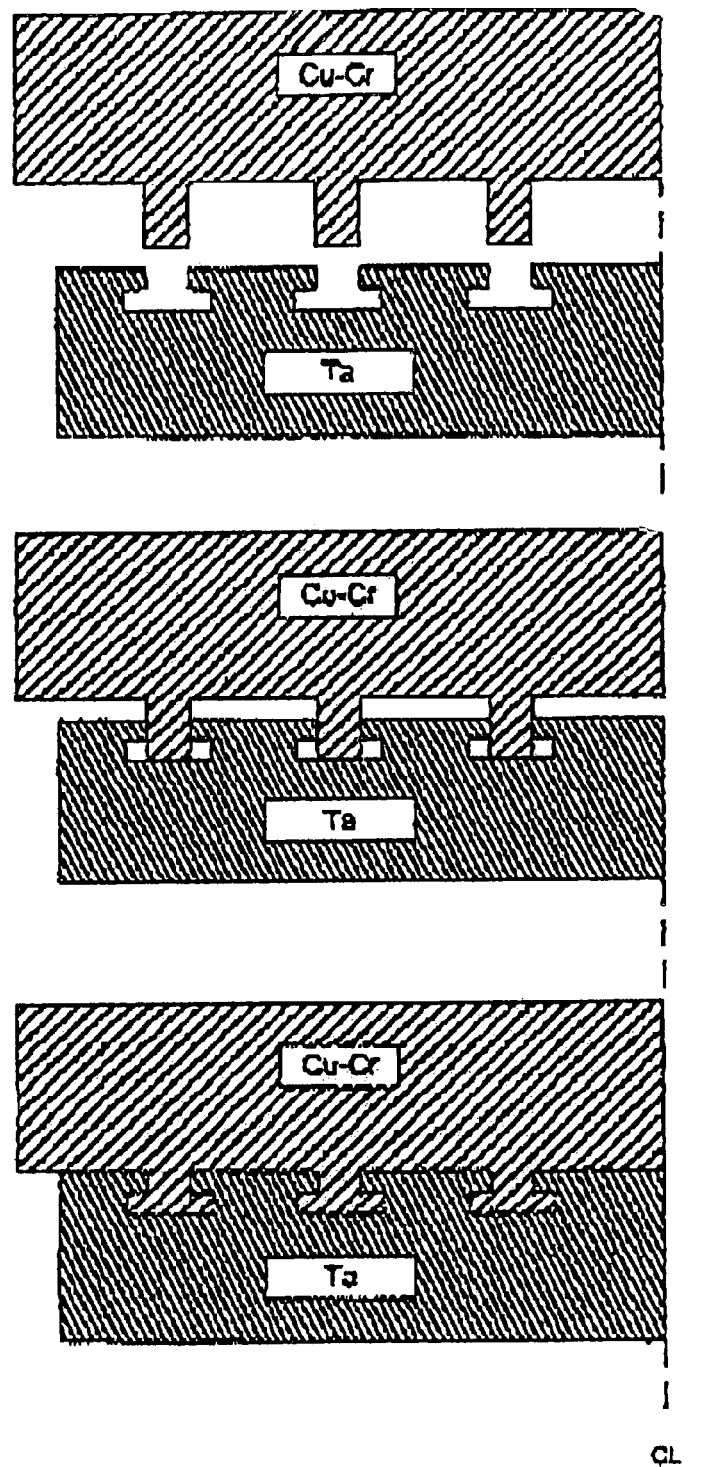
Figure 1. Resistance weld interlocking target assembly method.

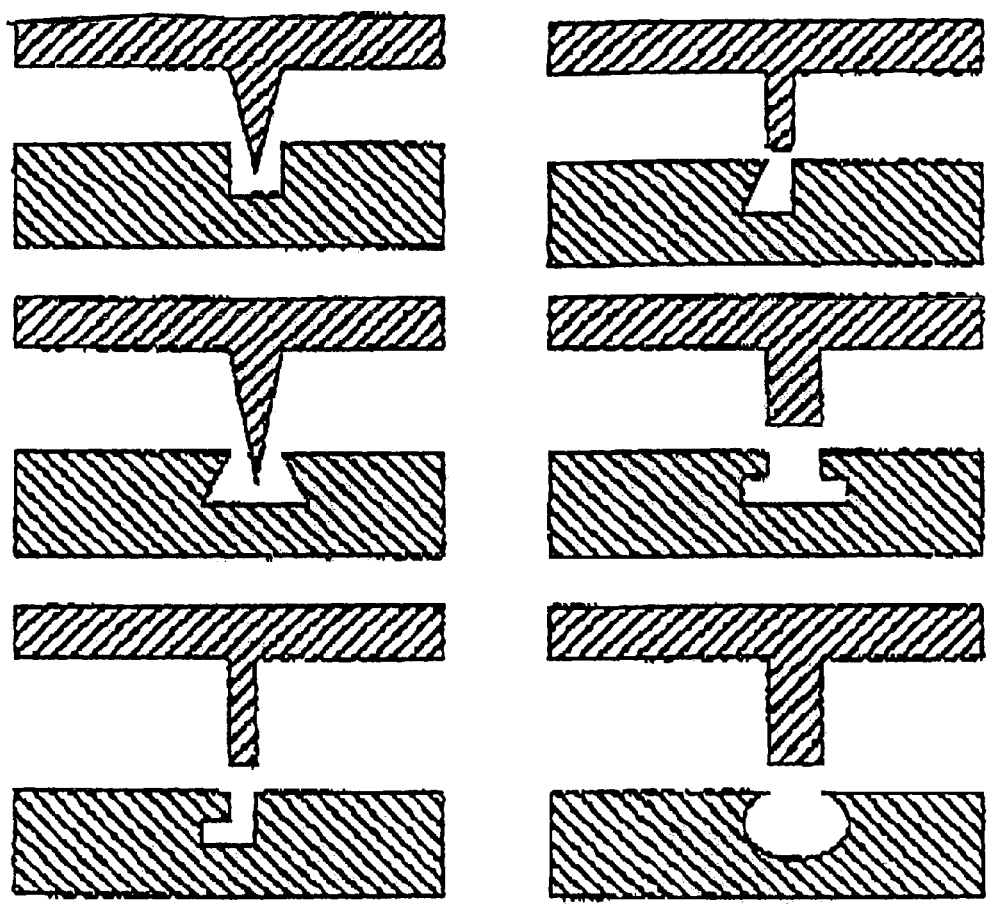
Figure 2. Variations on interlocking tooth and groove designs.

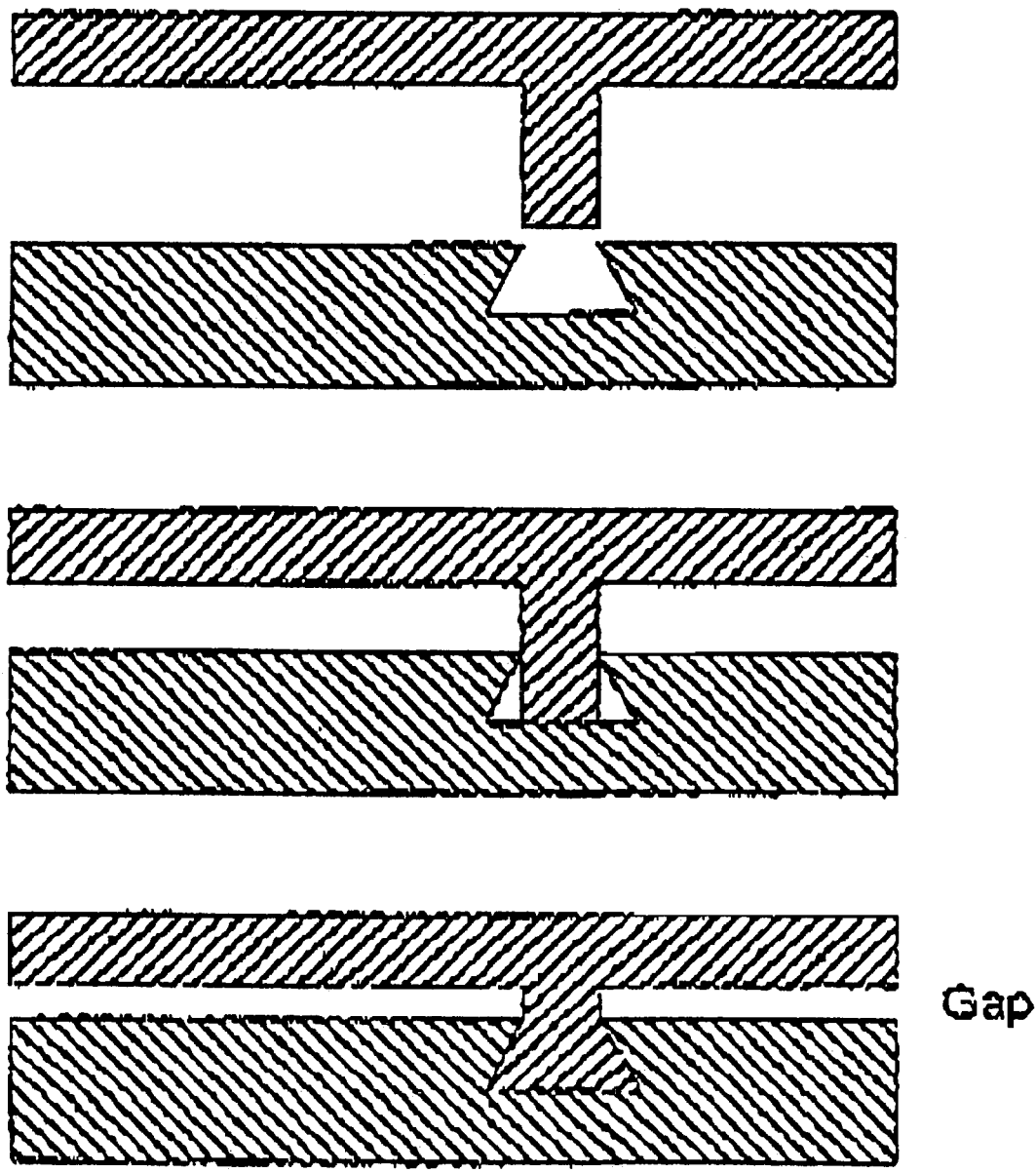
Figure 3. Gap forming modification of the

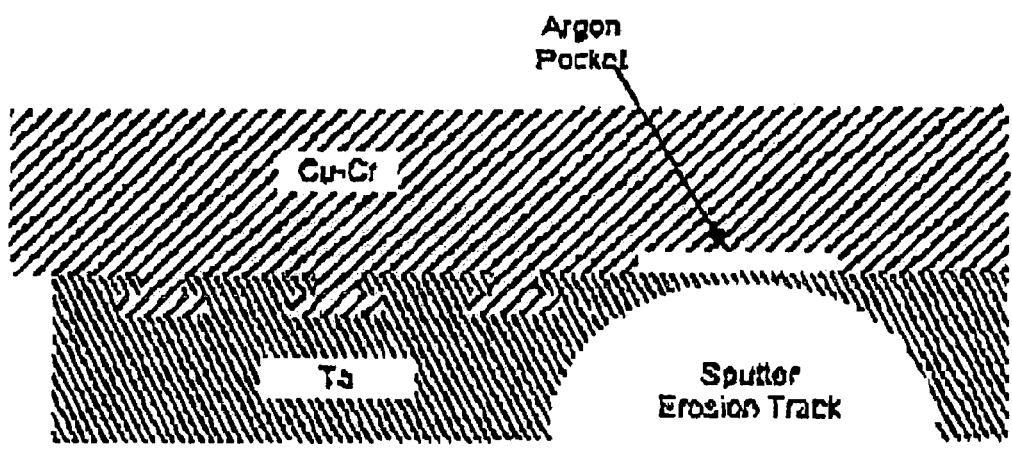
Figure 4. Formation of an argon pocket at the sputter erosion track to provide sputter

SPUTTERING TARGET ASSEMBLIES USING RESISTANCE WELDING

BACKGROUND OF THE INVENTION

The present invention relates to sputtering target assemblies and other metal articles, as well as methods of making the same. More particularly, the present invention relates to methods to bond various metals together to form bonded sputtering target assemblies and other bonded articles, preferably at a low temperature.

In the sputter application field, typically a sputtering target assembly has a sputter target and a backing plate. For instance, a metal target or metal target blank (e.g., tantalum, titanium, aluminum, copper, cobalt, tungsten, etc.) is bonded onto a backing plate, such as a backing plate flange assembly such as copper, aluminum, or alloys thereof. To achieve good thermal and electrical contact between the target and the backing plate, these members are commonly attached to each other by means of soldering, brazing, diffusion bonding, clamping, and by epoxy cement and the like. However, sputtering target assemblies bonded by methods at high temperatures can warp the assembly during use which affects performance of the sputtering target assembly, especially when a large difference exists between the coefficients of thermal expansion for the target and the backing plate. Moreover, the differential thermal expansion between the target material and the backing plate material which occurs when bonding is accomplished at elevated temperatures by soldering, brazing, or diffusion bonding, generates very high levels of mechanical stress in the metal bodies. The mechanical stress often causes deflection of the target assembly and can lead to bond failure so that the target separates from the backing plate during sputtering.

The bonding process also adds weight and creates the risk of having a target assembly debond while in use. The debonding risk is even made more possible due to the continuing progression of the industry to want to use increasingly larger targets.

Additionally, the high temperatures associated with some conventional bonding methods can result in undesirable grain growth in the target metal.

SUMMARY OF THE PRESENT INVENTION

A feature of the present invention is to provide a method of forming a sputtering target assembly which avoids the debonding issue by providing a fail-safe bond between the target and the backing plate.

Another feature of the present invention is to provide a method of forming a sputtering target assembly for controlling thermal resistance at the interface of the target and the backing plate.

A further feature of the present invention is to provide a method of forming a sputtering target assembly which prevents unintended sputtering of the backing plate.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a method of forming a sputtering target assembly. The method provides for bonding a target and a backing plate that are typically made from metal. The method involves contacting a portion of at least one projection on a bonding side of a first assembly member having a plurality of projections, against a portion of a groove on a bonding side of a second assembly member having a plurality of grooves; contacting a first electrode to one of the assembly members, and a second electrode to the other assembly member; conducting an electric current through the electrodes to cause resistance heating of the projection and the groove; and partially deforming the projection to a least partially fill the groove by applying a force between the projection and the groove, thereby forming at least a mechanical bond between the assembly members.

The present invention further relates to a resistance weld bonding method of making a sputtering target assembly which contains a backing plate and a sputter target blank which are typically made from materials having dissimilar thermal expansion coefficients.

The present invention also relates to a method of forming a sputtering target assembly by aligning projections on an assembly member with the grooves on another assembly member that are adapted to receive the projections. The heat produced by electric current applied to the surfaces of the projections and/or the grooves causes the projections to soften and deform to fill in the grooves. When the projections harden, a mechanical and sometimes a metallurgical interlock is formed between the target and the backing plate.

Also, the present invention relates to a method of forming a sputtering target assembly which forms a gap between the assembled target and backing plate which reduces heat transfer between the target and the backing plate and increases the equilibrium temperature of the target during the sputtering process. The size of the gap between the assembled target and backing plate can be controlled by varying the relationship between the volume of the projections and the volume of the grooves.

Also, the present invention relates to a method of forming a sputtering target assembly that includes a mechanism for preventing the target user from sputtering into the backing plate. The mechanism includes a gas cell, preferably located in areas of greatest sputter erosion, that bursts when the layer of target adjacent the cell is eroded to a predetermined thickness. When the cell bursts, a transient pressure occurs and pressure monitors in the sputtering enclosure signal to the user to stop the sputtering process.

It is to be understood that both the foregoing general description and the following detailed description are exemplary and explanatory only and are intended to provide a further explanation of the present invention, as claimed.

The accompanying drawings, which are incorporated in and constitute a part of this application, illustrate various aspects of the present invention and together with the description, serve to explain the principles of the present invention.

BRIEF DESCRIPTION OF THE DRAWINGS

FIG. 1 is a cutaway view of a sputtering target assembly and projection resistance welding system of the present invention.

FIG. 2 is a cutaway view of various shapes and sizes of projections and grooves of the present invention. Other shapes and sizes are possible.

FIG. 3 is a sputtering target assembly of the present invention showing a gap formed between the assembled target and backing plate.

FIG. 4 is a cutaway view of a sputtering target assembly of the present invention that includes a gas cell formed at the interface of the bonding surfaces of the target and the backing plate.

DETAILED DESCRIPTION OF THE PRESENT INVENTION

The present invention relates to a method of assembling a sputtering target assembly or other metal article by a bonding process that includes fixing a sputter target or other metal to a backing plate or other metal, preferably at a low temperature. The method includes contacting a portion of at least one projection on a bonding side of a first assembly member having a plurality of projections, against a portion of a groove on a bonding side of a second assembly member having a plurality of grooves; contacting a first electrode to one of the assembly members, and a second electrode to the other assembly member; conducting an electric current through the electrodes to cause resistance heating of the at least one projection and the groove; and partially deforming the at least one projection to a least partially fill the groove by applying a force between the projection and the groove, thereby forming at least a mechanical bond between the assembly members.

Preferably, the sputtering target assembly, as described above, includes two components or assembly members, i.e., a backing plate and a sputter target. The sputtering target and the backing plate can be any suitable target grade and backing plate grade materials, respectively. With respect to the target materials to be bonded by the method of the present invention, examples include, but are not limited to, tantalum, niobium, cobalt, titanium, copper, aluminum, and alloys thereof, for instance, the alloys described above. Examples of the backing plate include, but are not limited to, copper, or a copper alloy, tantalum, niobium, titanium, aluminum, and alloys thereof, such as TaW, NbW, TaZr, NbZr, TaNb, NbTa, TaTi, NbTi, TaMo, NbMo, and the like. No limitation exists as to the type of materials used in the sputter target and the backing plate. The thicknesses of the backing and the target materials can be any suitable thickness used for forming sputtering target assemblies. Alternatively, the backing plate and the target material or other metal plate to be bonded onto the backing plate can be any suitable thickness for the desired application. Examples of suitable thicknesses of the backing plate and of the target material include, but are not limited to, a backing plate with a thickness of from about 0.25 inches or less to about 2 inches or more in thickness, and targets with a thickness ranging from about 0.06 inches to about 1 inch or greater. In the present invention, the target material to be bonded onto the backing plate can be target grade material for instance as described in U.S. Pat. No. 6,348,113, incorporated in its entirety herein by reference. This patent shows examples of plate that can be prepared from starting ingots, plates or billets. The powder used to make the target grade plate as well as the target itself can have any purity with respect to the metal. For instance, the purity can be 99% or greater such as from about 99.5% or greater and more preferably 99.95% or greater and even more preferably 99.99% or greater, or 99.995% or greater or 99.999% or greater. The target grade plate can have any suitable grain (e.g., average grain sizes of less than 300 microns, less than 100 microns, less than 50 microns, less than 20 microns) and/or texture.

For instance, the texture for cubic metals can be random, a primary (111) texture, a primary (110) texture or a primary (100) texture that can be on the surface and/or throughout the entire thickness of the target. For HCP metals the texture can be primarily (1000), (11–20) or a random orientation. Preferably, the texture is uniform. Also, the target can have a mixed texture, such as a mixed (111):(110) texture throughout the surface or throughout the entire thickness of the target. In addition, the target can be substantially void of textural banding, such as substantially void of (100) textural banding.

The sputtering target assembly can also have an interlayer as is conventional in the industry. Furthermore, the sputter target can be a hollow cathode magnetron sputter target and can be other forms of sputter targets such as planar magnetron assemblies incorporating stationary or rotating permanent or electromagnets. The purity, texture, and/or grain size and other parameters, including size and the like are not critical to the present invention. The present invention provides a method of making a sputtering target assembly with any type of sputter target and backing plate.

The sputter target used to practice the present invention includes two sides, a sputtering side and an opposing bonding side. The backing plate of the present invention includes two sides, a bonding side and an opposing back side. The sputtering target assembly of the present invention is formed or assembled by fixing the bonding sides relative to each other. A bond interface is defined by an area between the bonding sides of the bonded assembly members. The bonding sides can be fixed to each other such that a surface of the bonding side of the backing plate and a surface of the bonding side of the sputter target are in substantial contact; the surfaces of the bonding sides are not in substantial contact; or, an interlayer can be interposed between a portion of the surfaces of the bonding sides. The interlayer can be a bonding media. The interlayer can also be in the form of a foil, plate, or block. Examples of interlayer materials can include, but are not limited to zirconium, niobium, Ta-Nb, titanium, copper, aluminum, silver, nickel, alloys thereof, graphite, and the like which are conventional in the industry. The materials described in U.S. Pat. Nos. 5,863,398, 6,071,389, 5,693,203, and 6,183,613 B1, each of which is incorporated in its entirety by reference herein, can be used.

The sputter target and the backing plate can be made from materials having dissimilar melting points. Grooves can be formed in the bonding side of either assembly member (i.e., target or backing plate), and are preferably formed in the assembly member having a melting point that is greater than that of the material from which the other assembly member is made. Preferably, the sputter target is made from a material having a higher melting point than that of the material from which the backing plate is made. Grooves can be formed by any suitable method including machining. The grooves can be formed to have a lengthwise dimension so that an extended groove track, channel, or cavity is formed. Preferably, the groove cavity is annular or elliptical so as to form a continuous recessed track. One or more cavities can be formed in the bonding side. Multiple groove cavities can be arranged concentrically.

The opening of the groove cavity is adapted to receive the projections on the assembly member having the projections. That is, the groove opening is of a sufficient dimension and shape to allow the projection to pass into the opening. Interior to the opening of the grooves, the diameter of the grooves can increase, decrease, or remain constant. The interior of the grooves can be of any shape and volume. FIG. 2 shows examples of variations on groove designs; others are possible. Groove shapes can be regular or irregular. A cross section of a groove can generally form a square, rectangle, "T", "L", semicircle, truncated triangle, cusp, bowtie, etc. An interlocking design results from a groove shape in which a projection and a groove engage by overlapping, and would generally include grooves in which an interior diameter of the groove is greater than the diameter of the groove opening, as well as various other designs, such as an "L"-shaped design. Also, as to a member having more than one groove cavity, the shape of the groove cavities can be dissimilar. Also, any one groove cavity can vary in shape along the length of the groove cavity. The grooves can be any depth such as from about 0.01 to about 0.5 inch or more, and, preferably, from about 0.025 to about 0.075 inch.

Projections can be formed in the bonding side of either assembly member, and are preferably formed on the assembly member having a melting point that is lower than that of the material from which the other assembly member is made. Preferably, the backing plate is made from a material having a lower melting point than that of the material from which the sputter target is made. The projections can be formed by any suitable method including machining. The projection has a distal end and an opposing proximal end that is attached at the bonding side of the assembly member. The distal end is of such a shape and a dimension to permit the projection to enter the opening of the corresponding groove in the groove-containing member and to come in contact with a surface of the interior of the groove. The projection can be of any size or shape. FIG. 2 shows variations on projection design; others are possible. A cross section of a projection can generally form a rectangle, triangle, or other suitable shape. The projection can be of any regular or irregular shape. The projection can be in the shape of a cylinder, cone, truncated cone, cube, cuboid, pyramid, obelisk, wedge, and the like.

The projections are arranged on the bonding side of the assembly member such that the projections can be mated with a corresponding groove on the bonding side of the other assembly member. Notably, the groove-containing assembly member may include a larger number of groove cavities than the number of projections on the projection-containing assembly member. That is, every groove need not have a corresponding projection. The projections can be spaced apart as desired. For example, the projections can be spaced so close to one another in a row so as to approximate a continuous ridge. Multiple projections can be arranged in rows. Preferably, the projections are arranged circularly. Multiple rows of grooves can be used to mate with the grooves in the groove-containing assembly member. Preferably, multiple rows of projections are arranged concentrically. The shape and dimension of any one projection in a row can be dissimilar to other projections in the same row. Likewise, concentric rows of projections can contain projections of dissimilar shape and dimension. The height of the projection measured from its proximal end to its distal end can be from about 0.01 to about 0.5 inches, and preferably from about 0.05 to about 0.2 inches. The projection can be any cross-section volume such as from about 0.0001 in.$^2$ to about 0.25 in.$^2$ or more. Preferably, the projection is made from a copper-chromium or copper-zinc alloy.

The general bonding process, based on projection seam welding, is shown in FIG. 1. The assembly members being bonded can be clamped tightly together, for example, by using a hydraulic press, which provides the preferred welding force to achieve contact between projections and the bottom of the grooves. As welding electrodes, a set of copper or copper alloy wheels can be used. Other conductive materials can be used. If the projection has a spiral shape, one wheel can be used. The bottom electrode can be in the shape of a wheel, wheel set, or in the shape of a plate. The current separation in this case would be performed due to the proximity effect.

The electric power is preferably applied to the assembly members via the electrodes in a pulse mode to thereby avoid overheating of the projections and perform "quasi" simultaneous heating by all electrodes. The speed of the wheel electrodes is preferably controlled to produce optimum heating temperatures. The average weld current applied via the electrodes is preferably, for example, in the range from 1,000 A to 500,000 A.

During the heating process, melting of the projections may or may not occur. Preferably the projections are not heated to their melting point temperature. The projections become soft due to the resistance heating at the projection/groove interface and in a locally affected area. The welding force applied during the heating cycle is preferably controlled so that collapse of the hot projections does not occur. Following the heating cycle, softened projections can be deformed by forging force applied by the hydraulic press. The joining force so applied can be constant or be varied. The joining force can be any force such as from about 10 to about 100,000 pounds, or any amount sufficient to provide force to permit deforming of the projection into the groove.

Partially deforming of the projections occurs when a heat produced by a electrical resistance created from contacting the projection and groove surfaces causes the projections to soften and deform at the point of contact and to substantially take the shape of the groove and thereby interlock, connect, or otherwise bond the sputter target and the backing plate when the projection hardens. The electrical resistance produced by contacting the projection with the groove in the manner described above, heats the surface of a projection and the surface of the groove to an elevated temperature in the region where the resistance heating occurs. The localized heating causes the low melting point material to soften and partially deform. Deformation of the projection occurs in the area that is in contact with the groove. Preferably, deforming of the projection occurs at the distal end of the projection. The softened material of the projection flows into the recesses of the groove. As the projection is deformed, the overall length of the projection is preferably shortened and the backing plate and the sputter target are displaced towards each other as long as pressure is applied in the direction perpendicular to the bond interface. When the desired degree of projection deforming is achieved, the forging force is reduced or eliminated and the relative lateral motion between the sputter target and the bonding plate ceases. When allowed to cool, the deformed portion of the projection hardens within the groove, thereby creating an interlocking mechanical connection and in some cases an optional metallurgical bond between the sputter target and the backing plate.

The preferred method of resistance welding of the projections with the grooves as described above, is to use a resistance seam welding machine to provide required pressure and current supply and rotation mechanism to perform the rotation of the sputter target and the backing plate or welding electrodes. A cover gas can be used for sputtering target applications to protect the metals from oxidation during the joining process and to fill any voids with argon to protect the target user from contamination. Preferably, the cover gas is an inert gas, and, more preferably, argon. Additionally, a dopant gas can be added to the cover gas to dope the heated regions with an interstitial hardening agent or other agents, known to those in the industry.

The shape and dimensions of the projections can be varied. For example, it may be desired to have some projections to make initial contact with the grooves while other projections contact the surface of the grooves when the distance between the bonding surfaces has been reduced. Another example according to an optional embodiment of the present invention is that a gap can be formed between a portion of the bonding surface of the sputter target and a portion of the bonding surface of the backing plate after having formed a locking bond, with the projections disposed intermittently in the gap. One method for forming such a gap, for example, is to have the volume of the projection greater than the volume of the groove such that the groove is substantially filled by the deformed distal end of the projection and a portion of the proximal end remains outside the opening of the groove. FIG. 3 shows an example of this optional embodiment of the present invention. The gap can be any width, such as from about 0.001 to about 0.25 inch or more. The width of the gap can vary at any point between the bonded assembly members. In certain embodiments, it is desirable to control the heat transfer or exchange between the sputter target and the backing plate during the sputtering process. Forming a gap between the sputter target and the backing plate reduces the heat transfer between the two, such that the temperature of the sputter target is increased during the sputtering process. Increasing the temperature of the sputter target can have the desired effects of stabilizing conditions for reactive sputtering; increasing the substrate temperature by radiative heating; and broadening the emission trajectories of the sputtered atoms, and thereby promoting uniformity of thickness of the deposited film layer.

In an optional embodiment of the present invention, a braze alloy can be located on any of the contacting surfaces including surfaces on the projections and/or surfaces on the groove. Similarly, a solder alloy can be located on any surface of the projection or the groove. Preferably, the braze or solder alloy has a melting point of at least 400° C. The braze or solder alloy is melted by the heat generated at the projection surfaces and the groove surfaces in the manner described above. The presence of the braze or solder alloy strengthens or permits the bond between the contact surfaces. Examples of brazing material include, but are not limited to, metal or alloys containing silver, niobium, tin, indium, zinc, lead, antimony, bismuth, aluminum, gold, cadmium, gallium, copper, nickel, vanadium, titanium, and/ or zirconium.

In an optional embodiment of the present invention, at least one cell member having a plurality of sides or walls is formed near the interface between the bonding surfaces of the sputter target and the backing plate. Preferably, the cell member is located in an area of greatest sputtering erosion. More than one cell member can be formed. The cell member can be filled with gas. The gas in the cell member can be an inert gas, preferably argon. The cell member can be of any shape, for example, rectangular or spherical. The shape of the cell member can be regular or irregular. Multiple cell members can have dissimilar shapes. The pressure of the gas in the cell member can be from about 0.1 to about 10 atmospheres, and is preferably about 1 atmosphere. The cell member can be of any volume, such as from about 0.1 to about 10 cubic inches. The cross-sectional dimensions of the cell can be from about 0.01 inch×0.1 inch to about 0.25 inch×2 inches, and more preferably from about 0.05 inch×0.5 inch to about 0.1 inch×1 inch. Preferably, at least one side of the cell member is a portion of the bonding surface of the sputter target. FIG. 4 shows an example of the embodiment. One or more walls of the cell member can be defined by a portion of the target member. One or more walls of the cell member can be defined by a portion of the backing plate. The cell member can be formed entirely in the backing plate. The cell member can be formed entirely in the sputter target. The cell member can be formed generally in the projection-containing assembly member in an area between two projections. The cell member can be formed generally in the groove-containing assembly member in an area between two grooves. The cell member can be formed by forming a pocket in the projection-containing assembly member, the groove-containing assembly member, or both. The cell member can be formed by joining the sputter target to the backing plate. A gas can be introduced in the cell member at the time that the cell member is formed. A gas can be introduced in the cell member by joining the sputter target and the backing plate under a gas. In an embodiment of the present invention wherein a gap is formed between the bonding sides of the assembly members, the cell member is preferably formed entirely in the sputter target in an area proximate a deepest portion of the groove.

The cell member is a mechanism for preventing the target user from sputtering into the backing plate. The cell member bursts when the layer of target adjacent the cell member is eroded to a predetermined thickness. When the cell member bursts, a transient pressure occurs in a sputtering chamber in which the sputtering process is conducted, and a pressure monitor(s) signals to the user to stop the sputtering process. An example of a pressure monitor that can be used is a capacitance manometer or a Pirani gauge.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method of forming a sputtering target assembly comprising a sputter target and a backing plate, the method comprising:
   contacting a portion of at least one projection on a bonding side of a first assembly member having a plurality of projections, against a portion of a groove on a bonding side of a second assembly member having a plurality of grooves;
   contacting a first electrode to one of said assembly members, and a second electrode to the other of said assembly members;
   conducting an electric current through said electrodes to cause resistance heating of said at least one projection and said groove; and
   partially deforming said at least one projection to at least partially fill said groove by applying a force between said at least one projection and said groove, thereby forming at least a mechanical bond between said assembly members.

2. The method of claim 1, wherein said assembly member having said projections is said sputter target and said assembly member having said grooves is said backing plate.

3. The method of claim 1, wherein said assembly member having said projections is said backing plate and said assembly member having said grooves is said sputter target.

4. The method of claim 1, wherein said assembly member having said grooves comprises cobalt, titanium, copper, aluminum, tantalum, niobium, nickel, molybdenum, zirconium, hafnium, gold, silver or alloys thereof.

5. The method of claim 1, wherein said assembly member having said grooves comprises tantalum or alloys thereof.

6. The method of claim 1, wherein said assembly member having said grooves comprises niobium or alloys thereof.

7. The method of claim 1, wherein said assembly member having said projections comprises cobalt, titanium, copper, aluminum, tantalum, niobium, or alloys thereof.

8. The method of claim 1, wherein said assembly member having said projections comprises a copper-chromium or copper-zinc alloy.

9. The method of claim 1, wherein said projections are of irregular shape.

10. The method of claim 1, wherein said projections are substantially cylinders, cones, truncated cones, cubes, cuboids, pyramids, obelisks, or wedges, or combinations thereof.

11. The method of claim 1, wherein said grooves are substantially in the shape of a square, rectangle, "T", "L", semicircle, truncated triangle, cusp, or a bowtie.

12. The method of claim 1, wherein said bond is formed such that a portion of the bonding side of said sputter target contacts at least a portion of the bonding side of said backing plate.

13. The method of claim 1, wherein said bond is formed such that a gap is formed between at least a portion of the bonding side of the sputter target and a portion of the bonding side of said backing plate.

14. The method of claim 1, wherein at least one groove has a shape that is different from a shape of at least one other groove.

15. The method of claim 1, wherein at least one projection has a shape that is different from a shape of at least one other projection.

16. The method of claim 1, wherein at least one groove has a volume that is different from a volume of at least one other groove.

17. The method of claim 1, wherein at least one projection has a volume that is different from a volume of at least one other projection.

18. The method of claim 1, wherein said bond comprises an interlocking bond.

19. The method of claim 1, further comprising forming a cell member having a plurality of sides in one of said assembly members.

20. The method of claim 19, wherein at least one of said sides comprises a portion of the bonding side of said assembly member having said grooves.

21. The method of claim 19, further comprising disposing a gas in said cell member.

22. The method of claim 19, wherein said gas comprises argon.

23. The method of claim 22, wherein a pressure of said gas in said cell member is about 1 atmosphere.

24. The method of claim 1, wherein forming said sputtering target assembly is under a cover gas.

25. The method of claim 24, wherein said cover gas comprises an inert gas.

26. The method of claim 25, wherein said inert gas comprises argon.

27. The method of claim 24, wherein said cover gas is doped with interstitial hardening agents.

28. The method of claim 1, wherein a metallurgical bond is formed between said assembly members.

29. A sputtering target assembly comprising:
an assembly member having a bonding side with a plurality of projections; and
an assembly member having a bonding side with a plurality of grooves, wherein said assembly member having said grooves is a metal having a melting point higher than that of the metal which comprises said projections, and wherein at least one groove is substantially filled by one projection via resistance heating of said at least one groove and said projection such that said assembly members are at least mechanically bonded together.

30. The sputtering target assembly of claim 29, wherein said assembly member having said grooves is a sputter target and said member having said projections is a backing plate.

31. The sputtering target assembly of claim 29, wherein said assembly member having said grooves is a backing plate and said member having said projections is a target.

32. The sputtering target assembly of claim 29, wherein a gap exists between a portion of said bonding sides.

33. The sputtering target assembly of claim 32, wherein a width of said gap is from about 0.001 inch to 0.1 inch.

34. The sputtering target assembly of claim 29, wherein a portion of said bonding sides are in contact.

35. The sputtering target assembly of claim 29, further comprising at least one cell member proximate to an interface defined by a portion of said bonding sides.

36. The sputtering target assembly of claim 35, wherein said cell member contains a gas at a pressure of from about 0.1 atmosphere to about 5 atmospheres.

37. The sputtering target assembly of claim 29, wherein said assembly member having said grooves comprises cobalt, titanium, copper, aluminum, tantalum, niobium, nickel, zirconium, hafnium, silver, gold or alloys thereof.

38. The sputtering target assembly of claim 29, wherein said assembly member having said grooves comprises tantalum or alloys thereof.

39. The sputtering target assembly of claim 29, wherein said assembly member having said grooves comprises niobium or alloys thereof.

40. The sputtering target assembly of claim 29, wherein said assembly member having said projections comprises cobalt, titanium, copper, aluminum, tantalum, niobium, nickel, zirconium, hafnium, silver, gold, molybdenum or alloys thereof.

41. The sputtering target assembly of claim 29, wherein said assembly member having said projections comprises a copper-chromium or copper-zinc alloy.

42. The sputtering target assembly of claim 29, wherein said projections are of irregular shape.

43. The sputtering target assembly of claim 29, wherein said projections are substantially cylinders, cones, truncated cones, cubes, cuboids, pyramids, obelisks, or wedges, or combinations thereof.

44. The sputtering target assembly of claim 29, wherein said grooves are substantially in the shape of a square, rectangle, "T", "L", semicircle, truncated triangle, cusp, or a bowtie.

45. A method of joining metal members comprising:
contacting a portion of at least one projection on a bonding side of a first metal member having a plurality of projections against a portion of a groove on a bonding side of a second metal member having a plurality of grooves;
contacting a first electrode to one of said members, and a second electrode to the other of said members;

conducting an electric current through said electrodes to cause resistance heating of said at least one projection and said groove; and partially deforming said at least one projection to a least partially fill said groove by applying a force between said at least one projection and said groove, thereby forming at least a mechanical bond between said members.

* * * * *